(12) United States Patent
Nakajima et al.

(10) Patent No.: US 12,526,929 B2
(45) Date of Patent: Jan. 13, 2026

(54) MANUFACTURING METHODS FOR COPPER-CLAD LAMINATE AND PRINTED WIRING BOARD

(71) Applicant: MITSUI MINING & SMELTING CO., LTD., Tokyo (JP)

(72) Inventors: Daisuke Nakajima, Ageo (JP); Shota Kawaguchi, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 356 days.

(21) Appl. No.: 18/016,090

(22) PCT Filed: Jul. 14, 2021

(86) PCT No.: PCT/JP2021/026505
§ 371 (c)(1),
(2) Date: Jan. 13, 2023

(87) PCT Pub. No.: WO2022/014647
PCT Pub. Date: Jan. 20, 2022

(65) Prior Publication Data
US 2023/0276579 A1  Aug. 31, 2023

(30) Foreign Application Priority Data
Jul. 16, 2020 (JP) ................................. 2020-121982

(51) Int. Cl.
H05K 3/38  (2006.01)
(52) U.S. Cl.
CPC ............. H05K 3/386 (2013.01); H05K 3/384 (2013.01); *H05K 2201/015* (2013.01); *H05K 2201/0355* (2013.01)

(58) Field of Classification Search
None
See application file for complete search history.

(56) References Cited

U.S. PATENT DOCUMENTS

| | | | | |
|---|---|---|---|---|
| 2007/0098910 A1* | 5/2007 | Yamagata | ............... | H05K 3/384 |
| | | | | 428/209 |
| 2012/0135266 A1* | 5/2012 | Kaminaga | ............... | B32B 15/01 |
| | | | | 428/658 |
| 2016/0183380 A1* | 6/2016 | Ishii | ..................... | H05K 3/025 |
| | | | | 156/247 |
| 2017/0208686 A1* | 7/2017 | Fukuchi | .................... | C22F 1/08 |
| 2018/0139848 A1 | 5/2018 | Tateoka et al. | | |
| 2018/0160529 A1* | 6/2018 | Arai | ..................... | H05K 3/384 |
| 2021/0029823 A1 | 1/2021 | Hosoi et al. | | |
| 2021/0360785 A1 | 11/2021 | Miyamoto et al. | | |
| 2021/0362475 A1* | 11/2021 | Miyamoto | ............... | H05K 3/06 |

FOREIGN PATENT DOCUMENTS

| | | |
|---|---|---|
| JP | 2017-130658 A | 7/2017 |
| JP | 2018-90903 A | 6/2018 |
| JP | 2019-163541 A | 9/2019 |
| TW | 201431678 A | 8/2014 |
| WO | 2010/147013 A1 | 12/2010 |
| WO | 2017/150043 A1 | 9/2017 |
| WO | 2019/188087 A1 | 10/2019 |
| WO | 2019/208525 A1 | 10/2019 |

OTHER PUBLICATIONS

Nickel Institute—Key properties of nickel—Feb. 26, 2025 (Year: 2025).*

* cited by examiner

*Primary Examiner* — John Vincent Lawler
(74) *Attorney, Agent, or Firm* — GREENBLUM & BERNSTEIN, P.L.C.

(57) ABSTRACT

Provided is a method for manufacturing a copper-clad laminate in which a copper foil and a resin are joined together with high heat-resistant adhesion force though a fluororesin, which is a low dielectric constant thermoplastic resin, is used. This method includes providing a surface-treated copper foil including a copper foil and a zinc-containing layer on at least one surface of the copper foil, and affixing a sheet-shaped fluororesin to the zinc-containing layer side of the surface-treated copper foil. The zinc-containing layer is composed of Zn and a transition element M having a melting point of 1200° C. or more. When the interface between the copper foil and the zinc-containing layer is subjected to elemental analysis by XPS, the content of Zn is 10 wt % or less, and the Zn/M weight ratio, the ratio of the content of Zn to the content of the transition element M, is 0.2 to 0.6.

7 Claims, No Drawings

MANUFACTURING METHODS FOR COPPER-CLAD LAMINATE AND PRINTED WIRING BOARD

TECHNICAL FIELD

The present invention relates to a method for manufacturing a copper-clad laminate and a printed wiring board.

BACKGROUND ART

With higher functionality of portable electronic equipment and the like in recent years, the frequencies of signals have become higher in order to process a large amount of information at high speed, and printed wiring boards suitable for high frequency applications such as base station antennas have been required. For such high frequency printed wiring boards, a reduction in transmission loss is desired in order to allow transmission without decreasing the quality of high frequency signals. A printed wiring board comprises a copper foil processed into a wiring pattern and an insulating resin substrate, and the transmission loss is composed mainly of the conductor loss due to the copper foil and the dielectric loss due to the insulating resin substrate. Therefore, it is convenient if a low dielectric constant thermoplastic resin can be used in order to reduce the dielectric loss due to the insulating resin substrate. However, low dielectric constant thermoplastic resins as typified by fluororesins such as polytetrafluoroethylene (PTFE) have low chemical activity and therefore have low adhesion force to copper foils, unlike thermosetting resins. Accordingly, techniques for improving the adhesion between a copper foil and a thermoplastic resin are proposed.

For example, Patent Literature 1 (WO2017/150043) discloses that adhesion to a fluororesin is ensured by using a copper foil comprising fine irregularities formed by oxidation treatment and reduction treatment.

CITATION LIST

Patent Literature

Patent Literature 1: WO2017/150043

SUMMARY OF INVENTION

However, in the copper-clad laminate in which the copper foil and a fluororesin substrate are bonded to each other disclosed in Patent Literature 1, the decrease in copper foil/substrate adhesion force at high temperature is still large, and further improvement of heat-resistant adhesion is required. Especially, printed wiring boards using fluororesins may be exposed to harsh environments such as high temperature, and even after the printed wiring boards are exposed to such harsh environments, high adhesion between the copper foil and the resin substrate is desired. Actually, printed wiring boards using fluororesins such as PTFE may be used for aviation and space use and the like, and also from such a viewpoint, even more improvement of adhesion at high temperature is desired. That is, it is required to achieve both adhesion and heat resistance between a copper foil and a fluororesin substrate.

The inventors have now found that by affixing a surface-treated copper foil comprising a zinc-containing layer having a predetermined interfacial composition to a fluororesin, it is possible to manufacture a copper-clad laminate having not only high adhesion but also excellent heat resistance with which the adhesion is less likely to deteriorate even at high temperature, that is, a copper-clad laminate in which a copper foil and a fluororesin are joined together with high heat-resistant adhesion force.

Therefore, it is an object of the present invention to manufacture a copper-clad laminate in which a copper foil and a resin are joined together with high heat-resistant adhesion force though a fluororesin, which is a low dielectric constant thermoplastic resin, is used.

According to an aspect of the present invention, there is provided a method for manufacturing a copper-clad laminate, comprising the steps of:

providing a surface-treated copper foil comprising a copper foil and a zinc-containing layer provided on at least one surface of the copper foil, and affixing a sheet-shaped fluororesin to the zinc-containing layer side of the surface-treated copper foil to obtain a copper-clad laminate, wherein the zinc-containing layer is composed of Zn and a transition element M having a melting point of 1200° C. or more, and wherein when an interface between the copper foil and the zinc-containing layer is subjected to elemental analysis by X-ray photoelectron spectroscopy (XPS), the content of Zn is 10% by weight or less, and a Zn/M weight ratio, which is a ratio of the content of Zn to the content of the transition element M, is 0.2 or more and 0.6 or less.

According to another aspect of the present invention, there is provided a method for manufacturing a printed wiring board, comprising the steps of:

manufacturing the copper-clad laminate by the above method, and forming a circuit on the copper-clad laminate to provide a printed wiring board.

DESCRIPTION OF EMBODIMENTS

Method for Manufacturing Copper-Clad Laminate

The present invention relates to a method for manufacturing a copper-clad laminate. The method of the present invention comprises the steps of (1) providing a surface-treated copper foil comprising a copper foil and a zinc-containing layer provided on at least one surface of the copper foil, and (2) affixing a sheet-shaped fluororesin to the zinc-containing layer side of the surface-treated copper foil to obtain a copper-clad laminate. The zinc-containing layer is composed of Zn and a transition element M having a melting point of 1200° C. or more. When the interface between the copper foil and the zinc-containing layer is subjected to elemental analysis by X-ray photoelectron spectroscopy (XPS), the content of Zn is 10% by weight or less, and the Zn/M weight ratio, the ratio of the content of Zn to the content of the transition element M, is 0.2 or more and 0.6 or less. By affixing the surface-treated copper foil comprising the zinc-containing layer having a predetermined interfacial composition to a fluororesin in this manner, it is possible to manufacture a copper-clad laminate having not only high adhesion but also excellent heat resistance with which the adhesion is less likely to deteriorate even at high temperature, that is, a copper-clad laminate in which a copper foil and a fluororesin are joined together with high heat-resistant adhesion force.

That is, as described above, low dielectric constant thermoplastic resins as typified by fluororesins such as polytetrafluoroethylene (PTFE) have low chemical activity and therefore intrinsically have low adhesion force to copper foils, unlike thermosetting resins. Even in the copper-clad laminate disclosed in Patent Literature 1 that addresses such a problem, the decrease in copper foil/substrate adhesion force at high temperature is still large. In this respect, according to the method of the present invention, as the surface-treated copper foil comprising the zinc-containing layer, one having an interface having a Zn content and a Zn/M ratio within the above ranges is selectively adopted and affixed to a fluororesin, and thus it is possible to manufacture a copper-clad laminate having not only high adhesion but also excellent heat resistance with which the adhesion is less likely to deteriorate even at high temperature, between a copper foil and a fluororesin.

(1) Provision of Surface-Treated Copper Foil

The surface-treated copper foil used in the method of the present invention comprises a copper foil and a zinc-containing layer provided on at least one surface of the copper foil. The copper foil is preferably a roughening-treated copper foil comprising roughening particles on at least one surface, and more preferably the surface of the copper foil on the zinc-containing layer side is a roughening-treated surface. A known roughening-treated copper foil can be used. The thickness of the copper foil is not particularly limited but is preferably 0.1 μm or more and 70 μm or less, more preferably 0.5 μm or more and 18 μm or less.

As long as the zinc-containing layer is composed of Zn and a transition element M having a melting point of 1200° C. or more, its form is not particularly limited. The zinc-containing layer is preferably an alloy of Zn and M, that is, a zinc alloy. Preferred examples of the transition element M having a melting point of 1200° C. or more include Co, Fe, Ni, Mo, W, and combinations thereof, more preferably Co, Ni, Mo, and combinations thereof, and is further preferably Ni and/or Mo, particularly preferably Ni. Therefore, the zinc-containing layer is preferably composed of a Zn—Co alloy, a Zn—Fe alloy, a Zn—Ni alloy, a Zn—Mo alloy, a Zn—W alloy, a Zn—Ni—Mo alloy, or a combination thereof, more preferably a Zn—Co alloy, a Zn—Ni alloy, a Zn—Mo alloy, or a Zn—Ni—Mo alloy, further preferably a Zn—Ni alloy, a Zn—Mo alloy, or a Zn—Ni—Mo alloy, and particularly preferably a Zn—Ni alloy.

As described above, when the interface between the copper foil and the zinc-containing layer is subjected to elemental analysis by XPS, the content of Zn is 10% by weight or less, preferably 1.0% by weight or more and 10.0% by weight or less, more preferably 2.0% by weight or more and 8.0% by weight or less, further preferably 2.1% by weight or more and 7.5% by weight or less, and particularly preferably 2.1% by weight or more and 7.0% by weight or less. The Zn content within the range particularly contributes to the improvement of copper foil/substrate adhesion (particularly normal state peel strength). When the interface between the copper foil and the zinc-containing layer is subjected to elemental analysis by XPS, the Zn/M weight ratio, the ratio of the content of Zn to the content of the transition element M, is 0.2 or more and 0.6 or less, preferably 0.22 or more and 0.58 or less, and more preferably 0.25 or more and 0.55 or less. The Zn/M weight ratio within the range particularly contributes to the improvement of heat resistance (particularly a property in which copper foil/substrate adhesion is less likely to deteriorate at high temperature).

In the present invention, the Zn content and the Zn/M weight ratio are determined by the interface between the copper foil and the zinc-containing layer, and this interface refers to the portion of the zinc-containing layer directly on the copper foil. This portion is less likely to be affected by surface oxidation and the like and considered as a region important in providing adhesion force and heat resistance. The position (depth) of the interface between the copper foil and the zinc-containing layer is defined as the inflection point in the curve formed by measurement depth (horizontal axis) and the amount of Cu (vertical axis) in elemental analysis by XPS carried out in the depth direction from the zinc-containing layer toward the copper foil. Specifically, a determination is made by the following i) to vi) steps:

i) With the surface of the zinc-containing layer opposite to the copper foil being at measurement depth $D_1$=0 nm, elemental analysis by XPS is performed with digging down in the depth direction therefrom toward the copper foil by sputtering. Elemental analysis is performed at a point at measurement depth $D_1$=0 nm simultaneously with the start of measurement by XPS, and after this, elemental analysis is performed at a point at measurement depth $D_n$ (n represents a measurement point) every predetermined sputtering time (for example, 20 seconds) from the start of the measurement. The measurement is performed at equal time intervals, for example, the measurement point after 20 seconds from the start of the measurement is at $D_2$, and the measurement point after 40 seconds is at $D_3$. One preferred example of the XPS measurement conditions is shown below (more specific measurement conditions will be shown in Examples described later).

(Measurement Conditions)

Ion gun setting: Ar gas, 1 kV, 2 mm×2 mm

Sputtering rate: 3.43 nm/min ii) The content of Cu at a measurement point n, $C_n$ (% by weight), is measured according to the above i).

iii) A graph is made with measurement depth $D_n$ as the horizontal axis and the content of Cu, $C_n$, as the vertical axis, and for the obtained curve, the slope of the tangent at a measurement point n, $S_n=(C_{n+1}-C_n)/(D_{n+1}-D_n)$, is calculated.

iv) From the slope of the tangent, $S_n$, obtained, the rate of change of the slope of the tangent, $\Delta S_n=S_{n+1}-S_n$, is calculated.

v) From the rate of change of the slope of the tangent, $\Delta S_n$, obtained, curvature $c_n=\Delta S_n/(D_{n+1}-D_n)$ is calculated.

vi) The measurement point providing curvature $c_n$=0 is identified as the Cu inflection point, and the point at measurement depth $D_n$ where this Cu inflection point is present is determined as the interface between the copper foil and the zinc-containing layer. For the Cu inflection point, in order to avoid accidental curvature $c_n$=0 due to plus/minus fluctuations in curvature $c_n$, the measurement point at curvature $c_n$=0 in the region where curvature $c_n$ begins to stably converge toward 0 is adopted. By adopting such a method, the interface between the copper foil and the zinc-containing layer can be uniquely identified.

The surface-treated copper foil preferably further comprises a chromate layer and/or a silane coupling agent layer on the surface on the zinc-containing layer side and more preferably comprises both a chromate layer and a silane coupling agent layer. By further comprising the chromate layer and/or the silane coupling agent layer, the adhesion to a fluororesin substrate can also be improved by combination with the zinc-containing layer, in addition to the improvement of rust proofing properties, moisture resistance, and chemical resistance.

(2) Affixation of Fluororesin

A sheet-shaped fluororesin is affixed to the zinc-containing layer side of the surface-treated copper foil to obtain a copper-clad laminate. This affixation of a fluororesin to the surface-treated copper foil may be performed according to a known procedure for manufacturing a copper-clad laminate and is not particularly limited. A method of affixing copper foils to an inner layer substrate via a fluororesin can also be adopted, and in this case, the affixation should be performed according to a known method such as the so-called buildup process. In any case, according to the method of the present invention, as the surface-treated copper foil comprising the zinc-containing layer, one having an interface having a Zn content and a Zn/M ratio within the above ranges is selectively adopted and affixed to a fluororesin. Thus, it is possible to manufacture a copper-clad laminate having not only high adhesion but also excellent heat resistance with which the adhesion is less likely to deteriorate even at high temperature, between a copper foil and a fluororesin. The affixation of a fluororesin to the surface-treated copper foil is preferably performed by pressing with heating. The temperature during pressing should be appropriately determined according to the properties of the fluororesin used, and is not particularly limited but is preferably 150 to 500° C., more preferably 180 to 400° C. The pressure is not particularly limited either but is preferably 1 to 10 MPa, more preferably 2 to 5 MPa.

The sheet-shaped fluororesin may be a cut sheet piece or a long sheet pulled out from a roll, and its form is not particularly limited. Preferred examples of the fluororesin include polytetrafluoroethylene (PTFE), tetrafluoroethylene-perfluoroalkyl vinyl ether copolymers (PFA), tetrafluoroethylene-hexafluoropropylene copolymers (FEP), tetrafluoroethylene-ethylene copolymers (ETFE), and any combination thereof.

The surface-treated copper foil may be provided on one surface of the sheet-shaped fluororesin or both surfaces. The sheet-shaped fluororesin should comprise a fluororesin and may further comprise other materials. Therefore, the sheet-shaped fluororesin may be a prepreg. A prepreg is a generic name for a composite material in which a substrate such as a synthetic resin plate, a glass plate, a glass woven fabric, a glass nonwoven fabric, or paper is impregnated with a synthetic resin. The fluororesin may further comprise filler particles composed of various inorganic particles such as silica and alumina, and the like from the viewpoint of improving insulating properties, and the like. The thickness of the sheet-shaped fluororesin is not particularly limited but is preferably 1 to 1000 μm, more preferably 2 to 400 μm, and further preferably 3 to 200 μm. The fluororesin layer may be composed of a plurality of layers.

Method for Manufacturing Surface-Treated Copper Foil

The surface-treated copper foil according to the present invention may be manufactured by any method as long as a zinc-containing layer can be formed on a copper foil. The surface-treated copper foil according to the present invention is preferably manufactured through zinc alloy plating. One example of a preferred method for manufacturing the surface-treated copper foil according to the present invention will be described below. This preferred manufacturing method comprises the steps of providing a copper foil, and performing zinc alloy plating on the surface.

(1) Preparation of Copper Foil

As the copper foil used for the manufacture of the surface-treated copper foil, both an electrodeposited copper foil and a rolled copper foil can be used, and the copper foil is more preferably an electrodeposited copper foil. The copper foil is preferably subjected to roughening treatment, and, for example, a roughening-treated surface in which roughening particles are deposited on a copper foil surface can be formed by electroplating using an aqueous solution comprising sulfuric acid and copper sulfate. The roughening-treated surface preferably has a maximum height Sz of 3.0 μm or more and 15.0 μm or less, more preferably 4.0 μm or more and 12.0 μm or less, as measured in accordance with ISO 25178. When the copper foil is prepared in the form of a carrier-attached copper foil, the copper foil may be formed by wet film formation processes such as an electroless copper plating process and an electrolytic copper plating process, dry film formation processes such as sputtering and chemical vapor deposition, or combinations thereof.

(2) Formation of Zinc-Containing Layer by Zinc Alloy Plating

A surface (for example, a roughening-treated surface) of the copper foil is preferably subjected to zinc alloy plating to form a zinc-containing layer. Examples of the zinc alloy plating include Zn—Co alloy plating, Zn—Fe alloy plating, Zn—Ni alloy plating, Zn—Mo alloy plating, Zn—W alloy plating, Zn—Ni—Mo alloy plating, and combinations thereof. The zinc alloy plating should be performed by a known electroplating method by preparing a plating solution so that the desired zinc alloy composition is obtained. For example, when Zn—Ni alloy plating is performed, electroplating is preferably performed using an aqueous solution comprising zinc oxide, nickel sulfate, and potassium diphosphate.

(3) Chromate Treatment

Chromate treatment is preferably performed on the copper foil on which the zinc-containing layer is formed, to form a chromate layer. For the chromate treatment, electrolysis is preferably performed at a current density of 0.1 to 10 A/dm$^2$ using a chromate treatment liquid having a chromic acid concentration of 0.5 to 8 g/L and a pH of 1 to 13, and this electrolysis is preferably performed for 1 to 30 seconds.

(4) Silane Coupling Agent Treatment

The copper foil is preferably subjected to silane coupling agent treatment to form a silane coupling agent layer. The silane coupling agent layer can be formed by appropriately diluting a silane coupling agent, applying the diluted silane coupling agent, and drying it. Examples of the silane coupling agent include (i) epoxy functional silane coupling agents such as 4-glycidylbutyltrimethoxysilane and 3-glycidoxypropyltrimethoxysilane, (ii) amino functional silane coupling agents such as 3-aminopropyltriethoxysilane, N-2-(aminoethyl)-3-am inopropyltrimethoxysilane, N-3-(4-(3-aminopropoxy)butoxy)propyl-3-am inopropyltrimethoxysilane, and N-phenyl-3-aminopropyltrimethoxysilane, (iii) mercapto functional silane coupling agents such as 3-mercaptopropyltrimethoxysilane, (iv) olefin functional silane coupling agents such as vinyltrimethoxysilane and vinylphenyltrimethoxysilane, (v) acrylic functional silane coupling agents such as 3-methacryloxypropyltrimethoxysilane, (vi) imidazole functional silane coupling agents such as imidazolesilane, and (vii) triazine functional silane coupling agents such as triazinesilane. When both the chromate layer and the silane coupling agent layer are formed on the surface of the zinc-containing layer, the order of forming them is not particularly limited.

Method for Manufacturing Printed Wiring Board

The copper-clad laminate of the present invention is preferably used for the fabrication of a printed wiring board. That is, according to a preferred aspect of the present invention, there is provided a method for manufacturing a printed wiring board, comprising the steps of manufacturing the copper-clad laminate, and forming a circuit on the copper-clad laminate to provide a printed wiring board. Specific examples regarding the printed wiring board include single-sided or double-sided printed wiring boards obtained by forming a circuit on the copper-clad laminate of the present invention, and multilayer printed wiring boards obtained by multilayering the single-sided or double-sided printed wiring boards. The multilayer printed wiring board may be obtained by forming circuits on a multilayer copper-clad laminate obtained by affixing copper foils to an inner layer substrate via a thermoplastic resin (for example, a fluororesin), or by further forming a buildup layer. The circuit formation method may be a subtractive process or a modified semi-additive process (MSAP). The printed wiring board fabricated using the copper-clad laminate of the present invention is suitably used as a high frequency substrate used in applications such as automobile antennas, cellular phone base station antennas, high performance servers, and anti-collision radars used in a high frequency band of signal frequencies of 10 GHz or more.

EXAMPLES

The present invention will be more specifically described by the following examples.

Examples 1 to 7

(1) Preparation of Surface-Treated Copper Foils

Various surface-treated copper foils comprising zinc-containing layers on copper foil surfaces based on known methods were provided. These surface-treated copper foils are obtained by sequentially subjecting the electrode surface of an electrodeposited copper foil (thickness 35 μm) to roughening treatment, Zn—Ni alloy plating (examples 1 to 5) or Zn—Ni—Mo alloy plating (examples 6 and 7), chromate treatment, and silane coupling treatment by known methods. For each surface-treated copper foil, elemental analysis was performed by XPS with digging down in the depth direction from the zinc-containing layer toward the copper foil by sputtering. This elemental analysis was performed under the following measurement conditions using a scanning dual X-ray photoelectron spectrometer (XPS) (manufactured by ULVAC-PHI, PHI Quantes).
(Measurement Conditions)
Output: 200 μm φ, 50 W
X-ray type: monochromatic Al Kα ray
Ion gun setting: Ar gas, 1 kV (examples 1 to 5) or 2 kV (examples 6 and 7), 2 mm×2 mm
Sputtering rate (in terms of $SiO_2$): 3.43 nm/min (examples 1 to 5) or 12.3 nm/min (examples 6 and 7)
Measured elements and orbitals: C 1s, O 1s, Si 2p, Cr 3p, Ni 2p3, Cu 2p3, Zn 2p3, Mo 3d (only examples 6 and 7)
Measured surface: measured from the zinc-containing layer toward the interface The position (depth) of the interface between the copper foil and the zinc-containing layer was determined by identifying the Cu inflection point based on the obtained elemental analysis results according to the above-described definition and procedure. The copper foil had been subjected to roughening treatment, and in the identification of the position of the interface, the roughening-treated layer (roughening particles) was considered to be also included in the copper foil. Then, the content of the Zn element in the total weight of the measured elements at the interface was calculated as the Zn content (% by weight), and the content of the transition element M (meaning Ni and Mo here) in the total weight of the measured elements at the interface was calculated as the M content (% by weight). The Zn/M weight ratio was calculated using the obtained Zn content and M content. The results were as shown in Table 1.

(2) Fabrication of Copper-Clad Laminate

As a fluoro resin substrate, a PTFE substrate (RO3003 Bondply, manufactured by ROGERS Corporation, thickness 125 μm, 1 ply) was provided. The surface-treated copper foil was laminated on this PTFE substrate so that the surface of the surface-treated copper foil on the zinc-containing layer side was abutted to the substrate. The laminate was pressed under the conditions of a pressure of 2.4 MPa, a temperature of 370° C., and a pressing time of 30 minutes using a vacuum press to fabricate a copper-clad laminate.

(3) Evaluation of Copper-Clad Laminate

For the fabricated copper-clad laminate, the various evaluations shown below were performed.

<Normal State Peel Strength to Fluororesin (PTFE)>

A 0.4 mm wide straight circuit was formed on the copper-clad laminate by a subtractive process using a cupric chloride etchant to obtain a test substrate comprising a straight circuit for peel strength measurement. This straight circuit was peeled off from the PTFE substrate in accordance with the A method (90° peel) in JIS C 5016-1994, and the normal state peel strength (kgf/cm) was measured. This measurement was performed using a table-top precision universal tester (AGS-50NX, manufactured by SHIMADZU CORPORATION). The results were as shown in Table 1.

<Heat-Resistant Peel Strength to Fluororesin (PTFE)>

The heat-resistant peel strength (kgf/cm) to PTFE was measured by the same procedure as the normal state peel strength to PTFE described above, except that a test substrate comprising a 0.4 mm wide straight circuit for peel strength measurement was placed in an oven, heated at 150° C. for 4 hours, and floated on a solder bath at 288° C. for 10 seconds. The results were as shown in Table 1.

<Heat-Resistant Deterioration Rate>

The decrease rate (%) of the heat-resistant peel strength to the normal state peel strength was calculated as the heat-resistant deterioration rate. The results were as shown in Table 1.

TABLE 1

| | Elemental analysis at interface between copper foil and zinc-containing layer | | | | | Properties of copper-clad laminate | | |
| --- | --- | --- | --- | --- | --- | --- | --- | --- |
| | Cu inflection point (nm) | Zn content (% by weight) | Ni content (% by weight) | Mo content (% by weight) | Zn/M weight ratio (M = Ni + Mo) | Normal state peel strength (kgf/cm) | Heat-resistant peel strength (kgf/cm) | Heat-resistant deterioration rate (%) |
| Ex. 1 | 18.9 | 5.4 | 10.2 | — | 0.53 | 1.57 | 1.62 | −3.2 |
| Ex. 2 | 18.9 | 2.2 | 8.5 | — | 0.26 | 1.53 | 1.52 | 0.4 |
| Ex. 3* | 18.9 | 2.2 | 3.3 | — | 0.67 | 1.57 | 1.32 | 16.1 |
| Ex. 4* | 18.9 | 10.6 | 2.8 | — | 3.79 | 1.08 | 0.92 | 14.9 |

TABLE 1-continued

| | Elemental analysis at interface between copper foil and zinc-containing layer | | | | Properties of copper-clad laminate | | |
|---|---|---|---|---|---|---|---|
| | Cu inflection point (nm) | Zn content (% by weight) | Ni content (% by weight) | Mo content (% by weight) | Zn/M weight ratio (M = Ni + Mo) | Normal state peel strength (kgf/cm) | Heat-resistant peel strength (kgf/cm) | Heat-resistant deterioration rate (%) |
| Ex. 5* | 18.9 | 0.4 | 3.0 | — | 0.14 | 1.36 | 0.92 | 32.1 |
| Ex. 6 | 30.7 | 1.1 | 3.0 | 0.4 | 0.32 | 1.67 | 1.65 | 1.2 |
| Ex. 7 | 30.7 | 1.8 | 5.3 | 0.7 | 0.29 | 1.59 | 1.61 | −1.3 |

*indicates a comparative example.

From the results shown in Table 1, it is seen that in examples 1, 2, 6, and 7 satisfying the conditions of the present invention, a Zn content of 10% by weight or less and a Zn/M (Zn/(Ni+Mo) here) weight ratio of 0.2 or more and 0.6 or less at the interface between the copper foil and the zinc-containing layer, the peel strength is generally high (that is, the adhesion is high), and the heat-resistant deterioration rate is significantly low (that is, the heat resistance is excellent), compared with the comparative examples, which are examples 3 to 5, not satisfying these conditions.

The invention claimed is:

1. A method for manufacturing a copper-clad laminate, comprising:
    providing a surface-treated copper foil comprising a copper foil and a zinc-containing layer provided on at least one surface of the copper foil, and
    affixing a sheet-shaped fluororesin to the zinc-containing layer side of the surface-treated copper foil to obtain a copper-clad laminate,
    wherein the zinc-containing layer is composed of Zn and a transition element M having a melting point of 1200° C. or more, and
    wherein the obtained copper-clad laminate is configured such that when an interface between the copper foil and the zinc-containing layer is subjected to elemental analysis by X-ray photoelectron spectroscopy (XPS), the content of Zn at the interface is 2.0% by weight or more and 8.0% by weight or less, and a Zn/M weight ratio, which is a ratio of the content of Zn to the content of the transition element M, is 0.2 or more and 0.6 or less, wherein a depth of the interface between the copper foil and the zinc-containing layer is defined as an inflection point in a curve plotting an amount of Cu as determined via XPS as a function of a depth direction from the zinc-containing layer toward the copper foil.

2. The method for manufacturing a copper-clad laminate according to claim 1, wherein the transition element M is at least one selected from the group consisting of Co, Fe, Ni, Mo, and W.

3. The method for manufacturing a copper-clad laminate according to claim 1, wherein the transition element M is Ni and/or Mo.

4. The method for manufacturing a copper-clad laminate according to claim 1, wherein the Zn/M weight ratio at the interface is 0.25 or more and 0.55 or less.

5. The method for manufacturing a copper-clad laminate according to claim 1, wherein the fluororesin is at least one selected from the group consisting of polytetrafluoroethylene, a tetrafluoroethylene-perfluoroalkyl vinyl ether copolymer, a tetrafluoroethylene-hexafluoropropylene copolymer, and a tetrafluoroethylene-ethylene copolymer.

6. The method for manufacturing a copper-clad laminate according to claim 1, wherein a surface of the copper foil on the zinc-containing layer side is a roughening-treated surface.

7. A method for manufacturing a printed wiring board, comprising:
    manufacturing the copper-clad laminate by the method according to claim 1, and
    forming a circuit on the copper-clad laminate to provide a printed wiring board.

* * * * *